Figure 1:
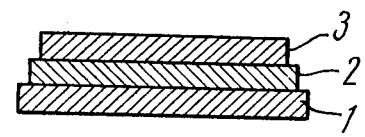
Figure 2:
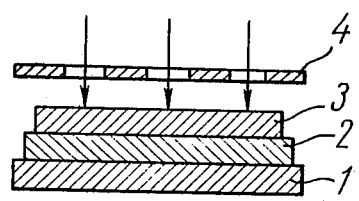
Figure 3:
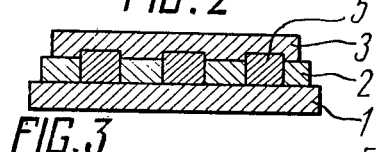
Figure 4:
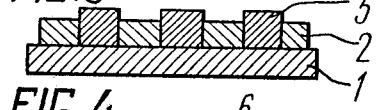
Figure 5:

United States Patent [19]

Voitovich et al.

[11] 4,042,450
[45] Aug. 16, 1977

[54] METHOD FOR THE PRODUCTION OF FILMS HAVING THE DESIRED CONFIGURATION

[76] Inventors: Igor Danilovich Voitovich, Zadorozhny pereulok, 4, kv. 61; Maxim Timofeevich Kostyshin, ulitsa Melnikova, 46, kv. 40; Ekaterina Vasilievna Mikhailovskaya, ulitsa Nikolsko-Botanicheskaya, 27-29, kv. 10; Vyacheslav Vasilievich Petrov, ulitsa Kapitanovskaya, 28, kv. 15; Petr Fedorovich Romanenko, prospekt Nauki, 120, kv. 51; Vladimir Petrovich Skuridin, prospekt 40 let Oktyabrya, 82, kv. 53, all of Kiev, U.S.S.R.

[21] Appl. No.: 422,925

[22] Filed: Dec. 7, 1973

Related U.S. Application Data

[63] Continuation of Ser. No. 136,877, April 23, 1971, abandoned.

[51] Int. Cl.² ............................................. C23F 1/02
[52] U.S. Cl. ...................................... 156/652; 96/36.2; 156/644; 156/656; 156/659; 156/662; 156/664; 156/665; 156/666

[58] Field of Search ............... 156/3, 4, 5, 8, 9, 17, 156/18, 22, 13, 629, 632, 644, 659, 663, 630, 634, 650-653, 662, 664-668; 250/65 R, 65.1; 96/36, 36.2, 36.4, 1.5; 117/933, 217; 252/79.2, 79.5; 427/43, 331, 250, 294-296

[56] References Cited

U.S. PATENT DOCUMENTS

| 3,305,359 | 2/1967 | Delmont | 96/1 R |
| 3,637,381 | 1/1972 | Hallman et al. | 156/4 X |
| 3,637,383 | 1/1972 | Hallman et al. | 156/4 X |
| 3,663,224 | 5/1972 | Hallman et al. | 29/625 X |
| 3,745,002 | 7/1973 | Honjo et al. | 96/36.3 X |
| 3,762,325 | 10/1973 | Hallman et al. | 96/36 |

*Primary Examiner*—William A. Powell

[57] ABSTRACT

A method for the production of films having the desired geometrical form (configuration) comprising depositing an electromagnetic radiation-sensitive system, which consists of a metal layer and an inorganic compound layer capable of reacting with said metal layer and forming interaction products under the effect of electromagnetic radiation, onto a film made from a material which does not react, on being irradiated, with the layer of said system that adjoins said film; subjecting said system to selective irradiation in conformity to the desired configuration, followed by carrying out the selective etching of the irradiated system so as to obtain the requisite configuration, and thereafter using said etched system as a mask for etching selectively said film in order to impart thereto the sought-for geometrical form.

6 Claims, 19 Drawing Figures

METHOD FOR THE PRODUCTION OF FILMS HAVING THE DESIRED CONFIGURATION

The application is a continuation of application Ser. No. 136,877; filed Apr. 23, 1971, now abandoned.

This invention relates to microelectronics and, more particularly, pertains to methods for the production of films having the desired geometrical form (configuration) such as, for example, photomasks, various components of microminiature circuits, and also diverse intricately shaped elements for optical instruments.

There is known a method for the production of films having the desired configuration, which comprises using an electromagnetic radiation-sensitive system consisting of a metal layer and an inorganic compound layer, said inorganic compound being capable of reacting, under the effect of irradiation, with said metal layer and forming appropriate products; subjecting said system to selective irradiation in compliance with the sought-for film configuration, and thereafter carrying out the selective etching of the irradiated system so as to obtain the desired configuration of the resultant film.

However, the known method is disadvantageous in that it makes possible to employ for making the films of desired geometrical forms only the materials that are capable of entering an active chemical reaction with one another on being irradiated, so that a wide range of materials, e.g. chromium, germanium, quarts ($SiO_2$) and the like, which are eminently suited for manufacturing films of the desired configuration, cannot be used for making said films by the known method, inasmuch as said materials do not react with one another under the effect of irradiation.

It is an object of the present invention to provide a method for the production of films having the desired configuration from an electromagnetic radiation-sensitive "metal-inorganic compound" system which will make it possible to obtain said films from any materials.

This object is achieved in that, according to the method of the present invention, a film (substrate), which is in a free state or securely attached to another substrate, is coated with a system sensitive to electromagnetic radiation which consists of a layer of metal and a layer of non-organic substance capable of entering into a chemical reaction with said metal under the effect of electromagnetic radiation. The resultant system is selectively irradiated in accordance with the desired configuration, the layer of non-organic substance which has not entered into a chemical reaction with the layer of metal is removed by etching, etching is then used to remove the reaction products, and the film (substrate) is etched to obtain a useful product. Alternatively, the metal layer is etched throughout its depth below the reaction products, after the layer of the non-organic substance which has not entered into reaction with the metal and the reaction products have been removed by etching, and then the film (substrate) is etched so as to yield a useful product. In another embodiment, the etched layer of metal is removed from areas that were not irradiated, after the layer of non-organic substance which has not entered into reaction with the metal layer is removed, and the film (substrate) is etched to obtain a useful product. In other words, a system sensitive to electromagnetic radiation and consisting of a layer of metal and a layer of non-organic substance is used, according to the present method, so as to provide a protective mask as is required for etching a film (substrate), from which a useful product is manufactured. The film (substrate) may be etched throughout, or only partially, with its depth depending upon the desired depth for the relief.

To manufacture microminiature circuit components, it is expedient to employ metal films.

For cryotron circuits, it is preferable to use films made from superconductors.

Dielectric films are preferred for making insulating layers of microminiature circuits.

Semiconductor films are useful for the fabrication of microminiature circuits incorporating semiconductor components.

The method of the invention is illustrated hereinbelow by the description of exemplary embodiments thereof with reference to the accompanying drawings, wherein FIGS. 1,2,3,4,5, and 6 illustrate a method of producing films having the desired configuration, according to the invention;

FIGS. 7,8,9,10,11,12, and 13 illustrate a modification of the method of producing films having the desired configuration, according to the invention, and FIGS. 14,15,16,17,18 and 19 illustrate one more modification of the method of producing films having the desired configuration, according to the invention.

One form of the present method consists in depositing onto a film made from a suitable material, such as a metal, a semiconductor, or a dielectric, an electromagnetic radiation-sensitive system comprising a metal layer and an inorganic compound layer, said system components being capable of entering a chemical reaction with each other. Onto said film there may be deposited first a metal layer and then an inorganic compound layer, or vice versa.

Figure 6:
Figure 7:
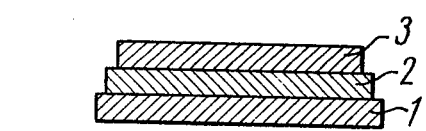
Figure 8:
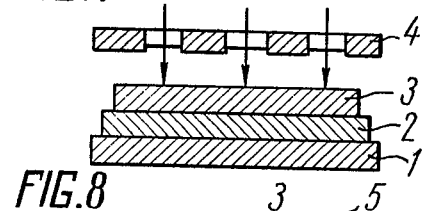
Figure 9:
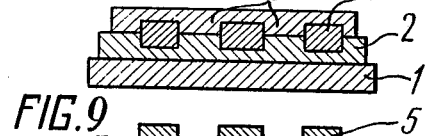
Figure 10:
Figure 11:

In a specific example of this form of the present method, onto a metal film 1 (FIG. 1), which is free or supported on a rigid substrate, e.g. a film obtained on a dielectric substrate by vacuum evaporation, is deposited a metal layer 2, such as a silver or copper layer, and then an inorganic compound layer 3, such as an arsenic trisulphide or a lead iodide layer. To deposite the metal layer 2 and the inorganic compound layer 3 onto the film 1, use may be made of the vacuum evaporation technique. When said metal-inorganic compound system is subjected to irradiation through a template (mask) 4 whose shape conforms to the desired configuration of the film to be obtained (FIG. 2), on the irradiated areas there form products 5 (FIG. 3) of interaction between the metal layer 2 and the semiconducting material layer 3, the thickness of the metal layer 2 being selected so as to provide for the formation of the interaction products 5 through the entire depth of the metal layer 2. Next use is made of a suitable selective etchant, such as a 20% aqueous solution of $Na_2CO_3$, to remove the semiconducting material layer 3 (FIG. 3) that has not interacted with the metal layer 2, followed by removing the interaction products 5 (FIG. 4) by means of a selective etchant. Then the film 1 is subjected to etching through ports 6 (FIG. 5) formed as a result of etching the interaction products 5. During this step, the metal layer 2 serves as a protective layer (mask) while the film 1 is being etched, thereby providing for the production of the film of the desired geometrical form (FIG. 6). If necessary, the metal layer 2, which functions as a mask at the step of etching the film 1, may subsequently be removed also by etching.

Figure 12:
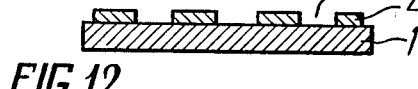
Figure 13:
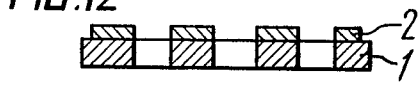
Figure 14:
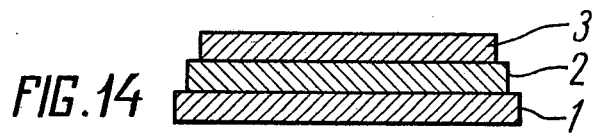
Figure 15:
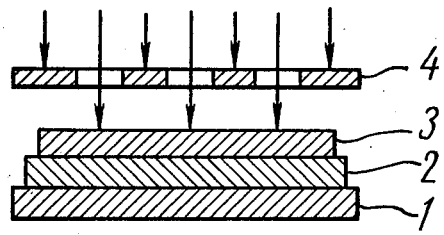
Figure 16:
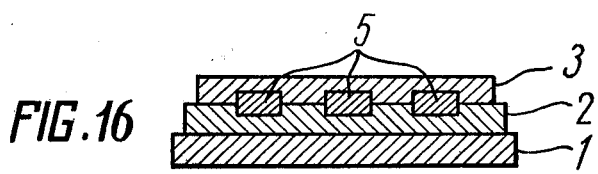
Figure 17:
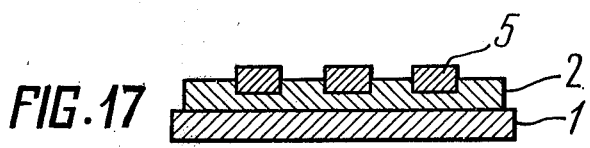
Figure 18:
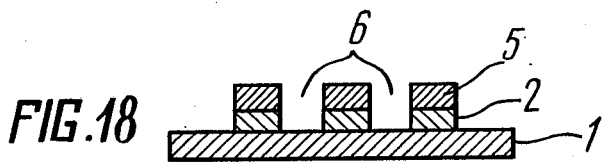

In case the layer 2 that adjoins the film 1 (FIGS. 1, 2, 3,) has an arbitrary thickness, the method of the present invention is altered (a second form of the invention) as follows. After the layer 3 and the interaction products 5 have been removed by etching (FIGS. 10 and 11), the layer 2 should be etched to a depth equal to the thickness of said layer under the interaction products 5 (FIG. 12). Next, the film 1 is etched through ports 6 (FIG. 13), said ports being formed as a result of etching the layer 2.

Figure 19:
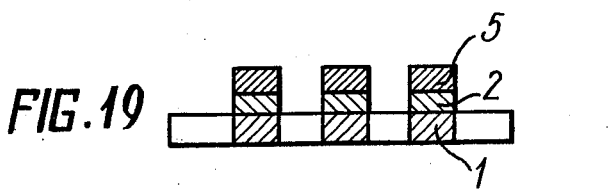

A third form of the present method for the production of films having the desired geometrical form is distinct from the first form in that the step of etching the layer 3 (FIGS. 14, 15, 16 and 17) is followed by removing not the interaction products 5, but the areas of the layer 3 (FIG. 18) which escaped irradiation. Then the film 1 is etched through the ports 6 formed as a result of etching the layer 3 (FIG. 19). If necessary, there may be removed the interaction products 5 and the areas of the layer 3 that are disposed under said interaction products.

The present method is advantageous in that it makes possible the production of films having the desired confiugaration by using diverse materials (metals, dielectrics, and semiconductors), particularly the materials which, on being irradiated, practically do not react with one another.

For example, by using the film 1 made from tin or lead in combination with the electromagnetic radiation-sensitive system consisting of silver (Ag) and arsenic trisulphide ($As_2S_3$), it is feasible to manufacture cryotron circuits having micron and submicron components.

With the film consisting of chromium or nickel and pairs, such as silver-arsenic trisulphide, silver-arsenic pentasulfide and the like, constituting the electromagnetic radiation-sensitive system, metallized precision photomasks can be readily manufactured.

To manufacture microminiature circuits having micron or submicron components, it is expedient to use the film made from aluminium, copper and other metals in conjunction with the electromagnetic radiation-sensitive system comprising one of the following systems: silver-arsenic trisulphide, silver-lead iodide, and the like.

The present method makes it possible to manufacture from suitable materials diffraction gratings, infra-red polarizers, instrument scales, graticules, and other component of optical systems.

Insulating layers of the desired geometrical form can be manufactured from a dielectric film, e.g. a quartz film, etc., and an electromagnetic radiation-sensitive system comprising a semiconductor-metal pair.

Microminiature circuits incorporating semiconductor components lend themselves to manufacture from a semiconducting compound film by the present method.

We claim:

1. A method for the production of films of desired configuration comprising the steps: of coating a film, or substrate, with a system sensitive to electromagnetic radiation and consisting of a layer of metal and a layer of an inorganic substance capable of entering into a reaction with said layer of metal under the effect of electromagnetic radiation to form reaction products; irradiating the system in accordance with the required configuration; removing by etching the layer of inorganic substance that has not entered into reaction with said layer of metal; removing by etching the layer of metal in areas that have not been irradiated; and etching said film or substrate in areas that have not been irradiated.

2. A method as claimed in claim 1, said material of the film, or substrate, being a metal selected from the group consisting of copper, tin, lead, aluminum, chromium and nickel; the metal of the system sensitive to electromagnetic radiation being silver, and said inorganic substance being a compound selected from the group consisting of arsenic trisulfide, arsenic pentasulfide and lead iodide.

3. A method as claimed in claime 1, wherein the material of the film, or substrate, is a metal selected from the group consisting of copper and tin, and said inorganic substance is a compound selectd from the group consisting of arsenic trisulfide and arsenic pentasulfide; comprising removing the layer of inorganic substance which has not entered into reaction with silver; romoving the layer of silver, and etching the film in areas that have not been irradiated.

4. A method as claimed in claim 1, said system sensitive to electromagnetic radiation being applied to said film, or substrate, by successively coating the latter with a layer of inorganic substance and a layer of metal; selectively etching said system by successively removing by etching the layer of metal and the layer of nonorganic substance in areas that have not been irradiated and etching the film or substrate in areas that have not been irradiated.

5. A method as claimed in claim 4, the material of the film, or substrate, being a metal selected from the group consisting of tin, lead, aluminum, chromium and nickel, the metal of the system sensitive to electromagnetic radiation being silver, and the inorganic substance being a compound selected from the group consisting of arsenic trisulfide, arsenic pentasulfide and lead iodide.

6. A method as claimed in claim 5, wherein the material of the film, or substrate, is aluminum, and the inorganic substance is a compound of arsenic trisulfide; comprising removing the layer of silver that has not entered into reaction with the layer of arsenic trisulfide removing the layer of arsenic trisulfide and etching the layer of aluminum in areas that have not been irradiated.

* * * * *